(12) United States Patent
Knowlton et al.

(10) Patent No.: US 7,628,902 B2
(45) Date of Patent: Dec. 8, 2009

(54) ELECTROCHEMICAL DEPOSITION METHOD UTILIZING MICRODROPLETS OF SOLUTION

(75) Inventors: William B. Knowlton, Boise, ID (US); Dale D. Russell, Boise, ID (US)

(73) Assignee: Boise State University, Boise, ID (US)

( * ) Notice: Subject to any disclaimer, the term of this patent is extended or adjusted under 35 U.S.C. 154(b) by 917 days.

(21) Appl. No.: 11/169,496

(22) Filed: Jun. 28, 2005

(65) Prior Publication Data

US 2006/0016691 A1    Jan. 26, 2006

Related U.S. Application Data

(60) Provisional application No. 60/584,854, filed on Jun. 30, 2004, provisional application No. 60/584,369, filed on Jun. 28, 2004.

(51) Int. Cl.
   *C25D 5/02*      (2006.01)
   *C25D 5/08*      (2006.01)
(52) U.S. Cl. .................. 205/136; 205/128; 205/133
(58) Field of Classification Search .................. 205/133, 205/128, 136
   See application file for complete search history.

(56) References Cited

U.S. PATENT DOCUMENTS

| | | | |
|---|---|---|---|
| 6,340,421 B1 * | 1/2002 | Vachon et al. | 205/133 |
| 6,503,831 B2 | 1/2003 | Speakman | 438/674 |
| 2003/0076649 A1 | 4/2003 | Speakman | 361/524 |

* cited by examiner

*Primary Examiner*—Harry D. Wilkins, III
*Assistant Examiner*—Nicholas A. Smith
(74) *Attorney, Agent, or Firm*—Pedersen & Co., PLLC; Ken J. Pedersen; Barbara S. Pedersen

(57) ABSTRACT

A method of electrochemical deposition uses microdroplets of electrolytic solution over a targeted small circuit element. Only the targeted circuit element is electrically biased so that deposition occurs on the surface of that element, underneath the microdroplet, and nowhere else unless it is under other microdroplet(s). The invented method achieves extremely accurate and selective electrochemical deposition with a tiny amount of electrolytic solution, compared to conventional submersive and/or immersive methods, and eliminates the need for masking or etching, reducing the costs of manufacture and amount of waste electrolytic solution produced.

21 Claims, 2 Drawing Sheets

ELECTROCHEMICAL DEPOSITION METHOD UTILIZING MICRODROPLETS OF SOLUTION

This application claims priority of Provisional Application Ser. No. 60/584,854, filed Jun. 30, 2004, entitled "Electrochemical Deposition Method Utilizing Microdroplets of Solution", and of Provisional Application Ser. No. 60/584,369, filed Jun. 28, 2004, entitled "Electrochemical Deposition Method Utilizing Microdroplets of Solution", both of which are hereby incorporated by reference.

BACKGROUND OF THE INVENTION

1. Field of the Invention

This invention relates generally to electrochemical deposition, and more particularly to selective electrochemical deposition on specific portions of a surface using microdroplets of solution rather than a standing pool of solution or immersion in a bath of solution.

2. Related Art

The development of miniaturized circuitry has made it necessary to selectively deposit various materials over certain areas of, for example, printed circuits. One method for accomplishing this is electrochemical deposition. However, existing methods of electrochemical deposition do not allow selective deposition over limited portions of a printed circuit. Under conventional methods, for example, a substrate to receive deposition is masked using photolithography. This masking serves to cover areas not being deposited. The masked substrate is then submerged, or otherwise dipped or immersed, in an electrochemical bath of electrolyte solution. The substrate is biased negatively, for example, such that electrochemical deposition occurs over the entire surface of the substrate. The masking is then removed.

This method results in a significant amount of unwanted deposition over the previously masked areas, in which material to be deposited is lost as waste. Additional loss of electrolyte solution occurs when the wet substrate is removed from the electrochemical bath and drained and dried.

The inventors have found no similar method of electrodeposition employed in research, in industrial use, nor in the patent prior art compared to the present invention. It is an object of the present invention to achieve a method of electrochemical deposition that deposits material on targeted areas only—i.e., a method that does not require masking, does not require submersion or immersion, and which requires minimal loss or waste of unwanted material following the deposition process. It is a further object of the present invention to achieve a method of electrochemical deposition that eliminates the need to submerge and then rinse or drain the substrate, reducing consumption and waste of the electrolytic solution, and eliminating the need for exposure of the entire surface of the substrate to the chemical bath.

SUMMARY OF THE INVENTION

The invented method for electrochemical deposition allows for selectively depositing material on chosen portions of a substrate without depositing on other portions of the substrate, and accomplishes this without masking or etching. A small droplet, on the order of less than about 1000 nanoliters of electrolytic solution, is placed over a circuit element where deposition of the electrolyte is desired. A current from a power supply is passed, typically from one electrode through the droplet of solution to one or more circuit elements that are connected to another electrode. The small area of droplet coverage allows deposition of an electrolyte on a selected circuit element or elements without a requirement of masking or deposition of material in unwanted areas of the circuit. The invented method thereby consumes less electrolyte solution by eliminating unwanted deposition, as compared to conventional methods, and also requires lower power consumption.

DETAILED DESCRIPTION OF THE INVENTION

Figure 1:
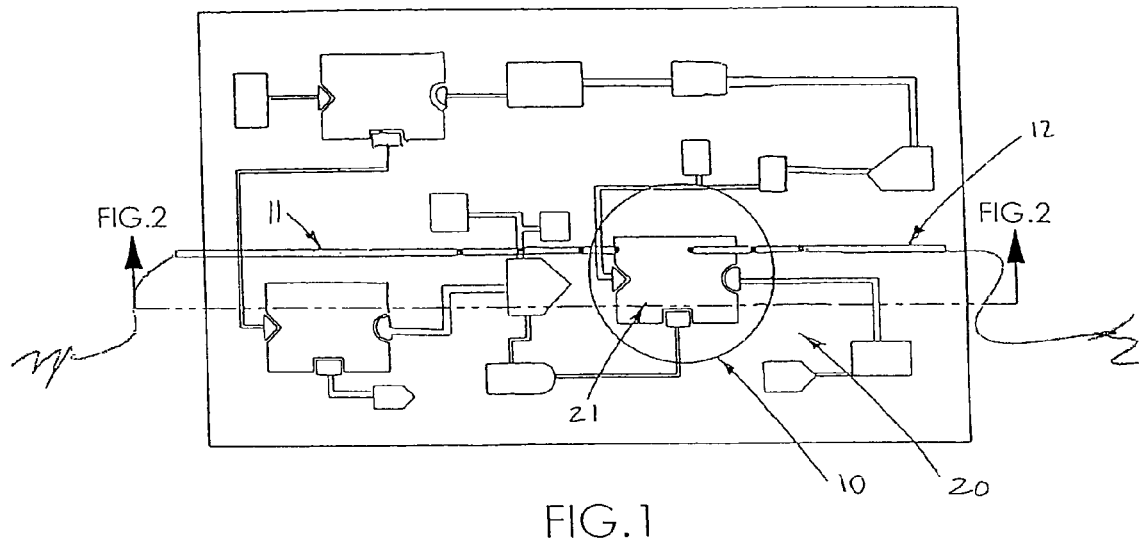
FIG. 1 is a top view of a microdroplet on a printed circuit board with two microprobes inserted into the microdroplet and one of the microprobes contacting a circuit element on the circuit board, according to one embodiment of the invention.
Figure 2:
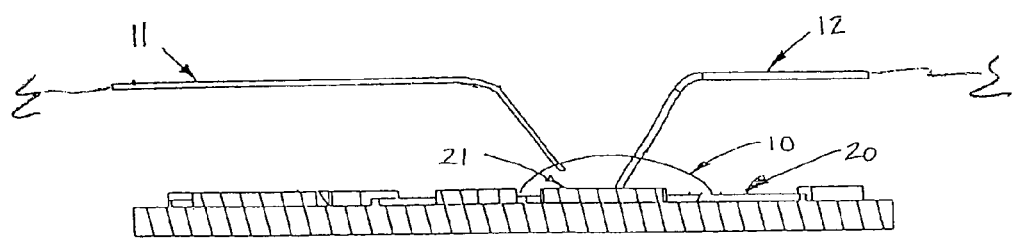
FIG. 2 is a side view of the embodiment of FIG. 1.

Referring to the figures, there are shown two, but not all, of the alternate embodiments of the invented method of electrochemical deposition. Contrary to conventional methods of electrochemical deposition, the invented method achieves selective deposition and eliminates the need for the conventional masking of areas where deposition is not desired, followed by subsequent immersion of the entire circuit in a chemical bath. The invented method may be utilized with any electrolyte solution, such as solvents containing metals, monomers, and polymers, any conventional dispersion, and may also be used in deposition of "neat" (undiluted) compounds.

Electrolyte solutions that may be used may include, but are not limited to:

Solutions using more polar solvents, for example: water, nitromethane, acetonitrile, ethanol;

Solutions using less polar solvents, for example: dichloromethane, benzonitrile, tetrahydrofuran, or any other liquid less polar than those in the first group, but with enough polarity to solvate the ionic compounds used as charge carriers in the medium;

Charge carriers, i.e. ionic compounds, for use in the more polar solvents, for example: sodium percholorate, potassium perchlorate, potassium chloride, sodium hydroxide, hydrocloric acid, nitric acid, sodium nitrate, and sodium acetate;

Charge carriers in the less polar solvents, for example: tetraalkylammonium salts of tetrafluoroborate and hexafluorophosphate, where the tetraalkyl groups may be methyl, ethyl, propyl and especially butyl, and even some higher mass alkyl groups; and Neat, undiluted liquids such as polymer-forming compounds may also be electro-deposited in the method of the present invention, therefore no charge carrier is necessarily required. In some embodiments, therefore, no electrolyte is required, as for example in the deposition of an electroactive material from its own undiluted pure liquid state. (E.G. depositing polythiophene from pure liquid thiophene, with no electrolyte and no solvent present).

Preferably, the electrolyte salts themselves are not deposited. The electroactive material may have one kind of conductivity characteristic in its solvated state, and an entirely different conductivity characteristic once deposited in its pure solid state.

Referring to the Figures, droplet 10, preferably a microdroplet, is deposited on substrate 20, typically a printed circuit. A "microdroplet" is a droplet at or below the critical volume, which is the volume at which a droplet is large enough that the solution's surface tension is no longer able to hold it in an approximately spherical or hemi-spherical shape—i.e., above the critical volume, a droplet begins to spread across a support surface. The critical volume of a droplet is a function of the surface energy at the boundaries between the solid (S), liquid (L), and vapor (V) phases. The critical volume is the volume at which the surface energy at the boundary of the solid and liquid phases (ELS) plus the surface energy at the boundary of the liquid and vapor phases (ELV) equals the surface energy at the boundary of the solid and vapor phases (ESV)—i.e., ELS+ELV=ESV. If ELS+ELV>ESV, the droplet is below the critical volume; if ELS+ELV<ESV, the droplet is above the critical volume.

A microdroplet of electrolytic solution containing the substance to be electro-deposited using the invented method would typically have a volume of less than about 1000 nanoliters, and preferably of 400 to 700 nanoliters. A typical aqueous solution could be 0.1 molar KCl, for example, and would also include the substance to be electrodeposited in concentration that could range from 0.001 M to 0.1 M, and, in some embodiments, 0.001 M to even greater than 0.1 M. A microdroplet form is preferred because surface tension in the microdroplet prevents spreading, allowing greater control of solution placement.

Droplet 10 in the Figures functions as an electrochemical cell, just as does the electrochemical bath in conventional immersive methods. Droplet 10 preferably is large enough to entirely cover the circuit element 21 where deposition is desired. However, it is desirable to keep droplet 10 as small as practical, without sacrificing complete coverage of the targeted circuit element, because an important object of the invention is to reduce waste by eliminating as much as possible the use of electrolytic solution beyond the minimum required to coat the targeted circuit element.

The deposited material may be a conductor, such as Cu, semi-conductor, such as CdS, or nonconductor (e.g., aluminum nitride (AlN) or $SiO_2$), as desired. These substances are conveyed via electrical field-driven migration (if they are charged ions in solution) or via concentration gradient-driven diffusion (if uncharged) or by a combination of these mechanisms. This mass transport of the electrodeposited material occurs in the droplet 10 as a result of the controlled flow of electrical current in the droplet. Microdroplets may be placed on the surface using a microliter pipette (not shown), which are commercially available from several sources, such as Rainin Research, Beckman, Eppendorf or VWR Scientific.

Two probes 11 and 12 may be inserted into droplet 10. First probe 11 contacts only droplet 10, and second probe 12 contacts electrical circuit element 21 where deposition is desired. A "probe" is any electrical conducting contact used to pass an electrical current through a circuit element and/or into the electrolytic solution of the microdroplet. Preferably, probes 11 and 12 are microprobes because of the very small size of droplet 10.

Figure 3:
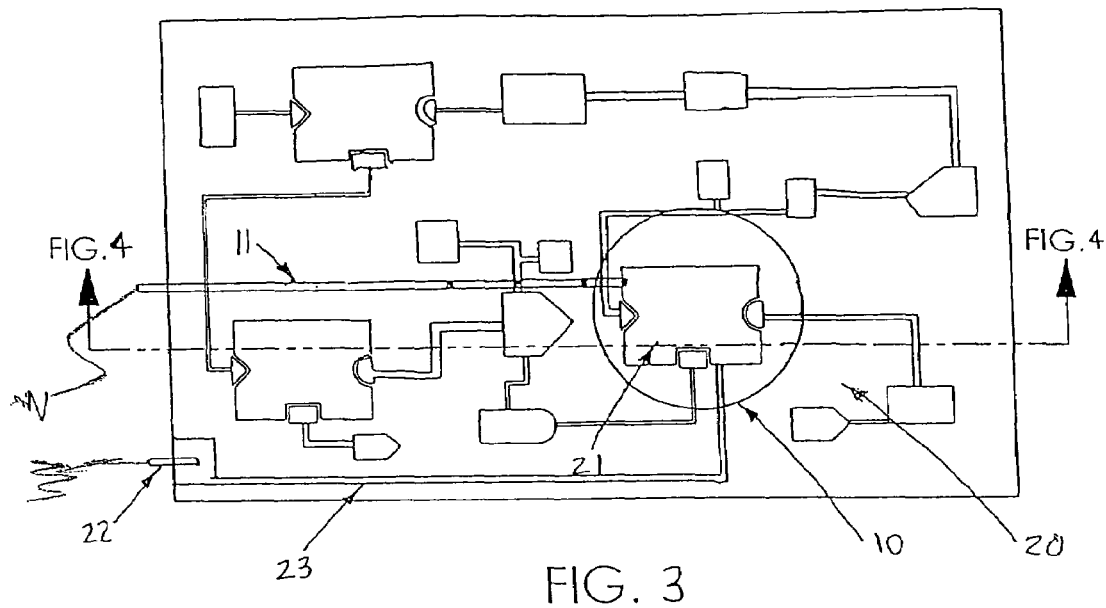
FIG. 3 is a top view of a microdroplet on a printed circuit board with one microprobe inserted into the microdroplet, and a circuit element being connected to a power supply, according to a second embodiment of the invention.
Figure 4:
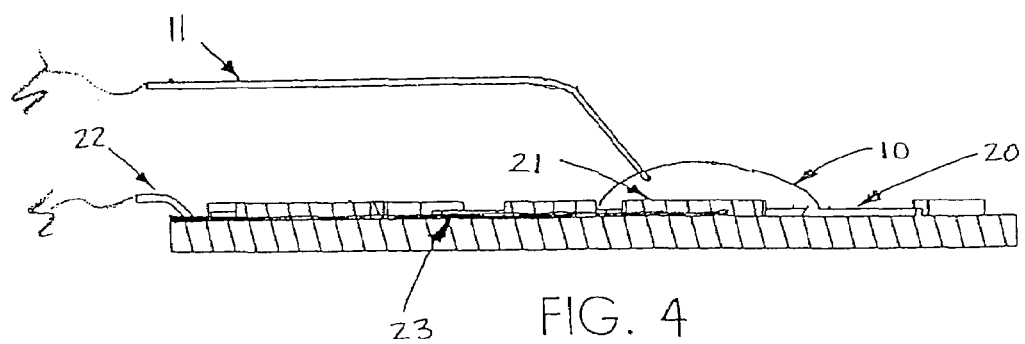
FIG. 4 is a side view of the embodiment of FIG. 3.

Depicting an alternate embodiment of the present invention, FIG. 3 is a top view of a microdroplet on a printed circuit board, with one microprobe 11 inserted into a microdroplet, according to a second embodiment of the invention. FIG. 4 is a side view of the embodiment of FIG. 3. In this embodiment, the single probe 11 conducts electrical current into droplet 10, while, as a departure from the previously described embodiment, circuit element 21 is activated electrically to act as a path for the current flowing through droplet 10.

For the purposes of this description, a "probe" is a "microprobe" if any of its dimensions are in the micron range. For example, a probe with a diameter of 100 microns (0.1 mm) is a microprobe even though its length is much longer. Also, a microprobe may be in the micron range only at or near the tip where the microprobe is inserted into the microdroplet. A microprobe constructed from fine gauge wire of a desired metal in one of several ways, including drawing out a fine gauge wire until it breaks. The microprobe may be a "nanowire," which is a conductive filament. Nanowires may be metallic, or they may be nanotubes such as carbon nanotubes, or they may be a single, long organic molecule having sufficient conjugation to pass electrons down its length. All of these types of nanowires have at least one dimension in the nanometer range. This size range may be present only at or near the tip, where the nanowire microprobe is to be inserted into the microdroplet. Many nanowires discussed in the literature are carbon nanotubes, and they are typically conducting. Many nanowires are semi-conducting as well (e.g., Si and ZnO).

The use of these very small probes permits electrical contact with the smallest circuit elements, including connections only a few nanometers wide. Alternatively, additional probes or microprobes may be used to contact the same or additional circuit elements. If deposition is to occur on two or more circuit elements, one or more probes 11 and 12 may contact each circuit element. Alternatively, one probe may contact one circuit element and the circuit element may be electrically connected to other circuit elements which are under the same microdroplet, or even under different microdroplets. Typically, a circuit element comprises an electrical device or combination of devices. A "device" is understood in the art to be an electronic element that cannot be divided without destroying its stated function, such as a transistor, capacitor, or resistor. However, a circuit element may comprise only a portion of any given device, as the instant invention may also be practiced on only a portion of a device.

Electrical current is passed through the solution via probes 11 and 12, causing deposition upon the contacted circuit element 21, but not on any adjacent areas of substrate 20. The current may be direct (DC) or alternating (AC) current. Also, the current used may be constant or varying. The voltage utilized may also be constant or varying. Any combination of current and voltage types described above may be used, as dictated by the characteristics of the substrate and solution being used. The length of time during which electrical current is passed, which may be over a range from sub-seconds to many seconds, depends on the rate of deposition and the amount of deposition desired.

Multiple layers of the same or different material may be deposited by this method at the same site by repeating this deposition method. The process may also be repeated on the same circuit element to create layers of deposited material; subsequent layers being of the same or different material as prior layers. The process may also be repeated on different circuit elements on the substrate to coat multiple circuit elements with any appropriate material. Preferably, the combined volume of droplet 10 and inserted portions of probes 11 and 12 will be less than the critical volume so that insertion of the microprobes will not cause the droplet 10 to spread.

The precise selectivity of this method allows it to be applied to specific microelectronic devices, even in areas with extremely high densities of devices. This selectivity can be maintained with even very small microelectronic devices.

The only limits on how small of a circuit element may be coated is the smaller of (a) the size of the molecule or atom being deposited, or (b) the size of the tip of the microprobe. It must be possible, within the size constraints, to contact the desired circuit element without contacting any other circuit element where deposition is not desired. Conceptually, with the use of nanowires, an element, such as a metal, may be coated on a substrate circuit element that is as narrow as the atom being coated, without coating other circuit elements.

After deposition is completed, the remaining electrolytic solution from the microdroplet may be removed. This is the only waste of electrolyte incurred with the method. This is dramatically less waste than with conventional immersive methods, which reduces costs, both in terms of the amount of reagent consumed and amount of waste. Such waste may be toxic or polluting, so it is of significant benefit to reduce waste volume.

In addition to reducing waste, the method of the present invention significantly reduces the number of steps involved in the entire process by eliminating pre-deposition treatment—e.g., masking—and post-deposition treatment—e.g., removing masking. Thus, the invented method is less time-consuming, which also reduces costs compared with conventional methods.

As an example of electro-deposition, in order to demonstrate the successful application of the method of the present invention, the inventors experimentally coated a test electrode with a polymer. The surface area of the electrode coated was approximately $6.25 \times 10^4$ micrometers$^2$. The size of the microdroplet applied was approximately 700 nanoliters.

The preferred polymer for this application was polythiophene modified to include chelating rings (preferably added to the thiophene monomer prior to polymerization, but having no part in the polymerization). The polymer was plated onto an aluminum electrode using a droplet of neat (undiluted) polymer liquid, and in separate tests using solvent diluted polymer liquid. (Dilutions for other applications could range from 0.001 moles of polymer-forming monomer per liter, up to neat concentrations).

In accomplishing the plating, typically a 2.5 milliampere current was passed through the solution via the test electrode for approximately one second, resulting in deposition across the electrode at an approximate thickness of approximately 400 nanometers in the neat application.

Although this invention has been described above with reference to particular means, materials, and embodiments, it is to be understood that the invention is not limited to these disclosed particulars, but extends instead to all equivalents within the scope of the following claims and drawings.

We claim:

1. A method of selective electrochemical deposition, comprising:

placement of a droplet of electrolytic solution on a substrate;

providing of a first probe in contact with said droplet, but not said substrate;

providing a second probe in said droplet and in contact with a circuit element on said substrate where in a part of said circuit element is in contact with said droplet; and establishing of an electrical current between said first probe and said second probe to induce electrochemical deposition upon said contacted circuit element.

2. The method of claim 1, wherein said droplet is a microdroplet.

3. The method of claim 2, wherein said microdroplet has a volume in the range of less than about 1000 nanoliters.

4. The method of claim 2, wherein said microdroplet has a volume in the range of about 400 to 700 nanoliters.

5. The method of claim 1, wherein the area on the substrate receiving deposited material is about $6.25 \times 10^4$ micrometers$^2$ or less.

6. The method of claim 1, wherein said electrical current is a DC current.

7. The method of claim 1, wherein said electrical current is an AC current.

8. The method of claim 1, wherein said electrical current is a constant current.

9. The method of claim 1, wherein said electrical current is a varying current.

10. The method of claim 1, wherein said electrical current is created with a constant voltage circuit.

11. The method of claim 1, wherein said electrical current is created with a varying voltage circuit.

12. The method of claim 1, wherein the electroactive material in said electrolytic solution deposits as a conductor.

13. The method of claim 1, wherein the electroactive material in said electrolytic solution is deposited to form a conductor.

14. The method of claim 1, wherein the electroactive material in said electrolytic solution deposits as a semi-conductor.

15. The method of claim 1, wherein the electroactive material in said electrolytic solution is deposited to form a semi-conductor.

16. The method of claim 1, wherein the electroactive material in said electrolytic solution deposits as a nonconductor.

17. The method of claim 1, wherein the electroactive material in said electrolytic solution is deposited to form a nonconductor.

18. The method of claim 1, wherein said first probe is a microprobe.

19. The method of claim 1, wherein said second probe is a microprobe.

20. The method of claim 1, wherein said first probe comprises a nanowire.

21. The method of claim 1, wherein said second probe comprises a nanowire.

* * * * *

UNITED STATES PATENT AND TRADEMARK OFFICE
CERTIFICATE OF CORRECTION

PATENT NO. : 7,628,902 B2 Page 1 of 1
APPLICATION NO. : 11/169496
DATED : December 8, 2009
INVENTOR(S) : Knowlton et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1198 days.

Signed and Sealed this

Second Day of November, 2010

David J. Kappos
*Director of the United States Patent and Trademark Office*